US010588220B2

(12) United States Patent
Weber

(10) Patent No.: US 10,588,220 B2
(45) Date of Patent: Mar. 10, 2020

(54) DRY METHOD OF METALLIZING POLYMER THICK FILM SURFACES

(71) Applicant: Molex, LLC, Lisle, IL (US)

(72) Inventor: Patrick Weber, Fremont, CA (US)

(73) Assignee: Molex, LLC, Lisle, IL (US)

(*) Notice: Subject to any disclaimer, the term of this patent is extended or adjusted under 35 U.S.C. 154(b) by 0 days.

(21) Appl. No.: 16/039,719

(22) Filed: Jul. 19, 2018

(65) Prior Publication Data
US 2019/0029119 A1 Jan. 24, 2019

Related U.S. Application Data

(60) Provisional application No. 62/535,088, filed on Jul. 20, 2017.

(51) Int. Cl.
H05K 1/09 (2006.01)
H05K 3/12 (2006.01)
H05K 3/24 (2006.01)
H05K 3/22 (2006.01)

(52) U.S. Cl.
CPC ............ H05K 3/12 (2013.01); H05K 3/1283 (2013.01); H05K 3/22 (2013.01); H05K 3/247 (2013.01); H01L 2224/48091 (2013.01); H01L 2224/48227 (2013.01); H01L 2924/15311 (2013.01); H05K 1/095 (2013.01); H05K 3/1216 (2013.01); H05K 2201/0215 (2013.01); H05K 2201/0245 (2013.01); H05K 2201/0257 (2013.01); H05K 2203/049 (2013.01); H05K 2203/1131 (2013.01); H05K 2203/1327 (2013.01)

(58) Field of Classification Search
CPC ............ H05K 1/095; H05K 3/12; H05K 3/22; H05K 2201/0215; H05K 2201/0245; H05K 1/167
See application file for complete search history.

(56) References Cited

U.S. PATENT DOCUMENTS

| | | | | |
|---|---|---|---|---|
| 4,396,666 A | * | 8/1983 | Ernsberger | C09D 163/00 228/121 |
| 4,404,237 A | * | 9/1983 | Eichelberger | H05K 3/246 338/308 |
| 5,272,596 A | * | 12/1993 | Honore | G06K 19/07 361/633 |
| 5,922,397 A | | 7/1999 | Brandt et al. | |
| 6,225,035 B1 | * | 5/2001 | Zhang | H01C 17/0652 427/97.2 |
| 6,599,408 B1 | * | 7/2003 | Chan | G01N 27/3271 204/291 |

(Continued)

FOREIGN PATENT DOCUMENTS

| | | |
|---|---|---|
| CN | 103262172 A | 8/2013 |
| KR | 10-2001-0060304 A | 7/2001 |
| WO | 2019/018613 A1 | 1/2019 |

OTHER PUBLICATIONS

International Search Report and Written Opinion for PCT application No. PCT/US2018/042845, dated Nov. 6, 2018, 9 pages.

Primary Examiner — Steven T Sawyer
(74) Attorney, Agent, or Firm — Molex, LLC

(57) ABSTRACT

A method of manufacturing includes bonding a paste material to an organic substrate by a polymer thick film (PTF) process to form a PTF trace, coating a sinterable material over the PTF trace, and sintering the sinterable material to the PTF trace.

7 Claims, 1 Drawing Sheet

(56) References Cited

U.S. PATENT DOCUMENTS

| | | | |
|---|---|---|---|
| 2004/0142165 A1* | 7/2004 | Fujii | B32B 5/16 |
| | | | 428/328 |
| 2009/0178271 A1* | 7/2009 | Egitto | H01C 17/06 |
| | | | 29/620 |
| 2010/0000083 A1* | 1/2010 | Yamaguchi | H05K 3/246 |
| | | | 29/831 |
| 2012/0114927 A1* | 5/2012 | Khaselev | B32B 5/16 |
| | | | 428/220 |
| 2012/0168211 A1* | 7/2012 | Lu | H05K 3/386 |
| | | | 174/257 |
| 2012/0212904 A1* | 8/2012 | Fleming | H01B 1/18 |
| | | | 361/679.56 |
| 2013/0252372 A1 | 9/2013 | Dong | |
| 2015/0213916 A1 | 7/2015 | Arancio et al. | |
| 2015/0231740 A1* | 8/2015 | Grabey | B23K 31/02 |
| | | | 428/457 |
| 2016/0225737 A1* | 8/2016 | Khaselev | B32B 5/16 |
| 2017/0033068 A1 | 2/2017 | Prack | |
| 2017/0044384 A1* | 2/2017 | Suh | H01B 1/22 |

* cited by examiner

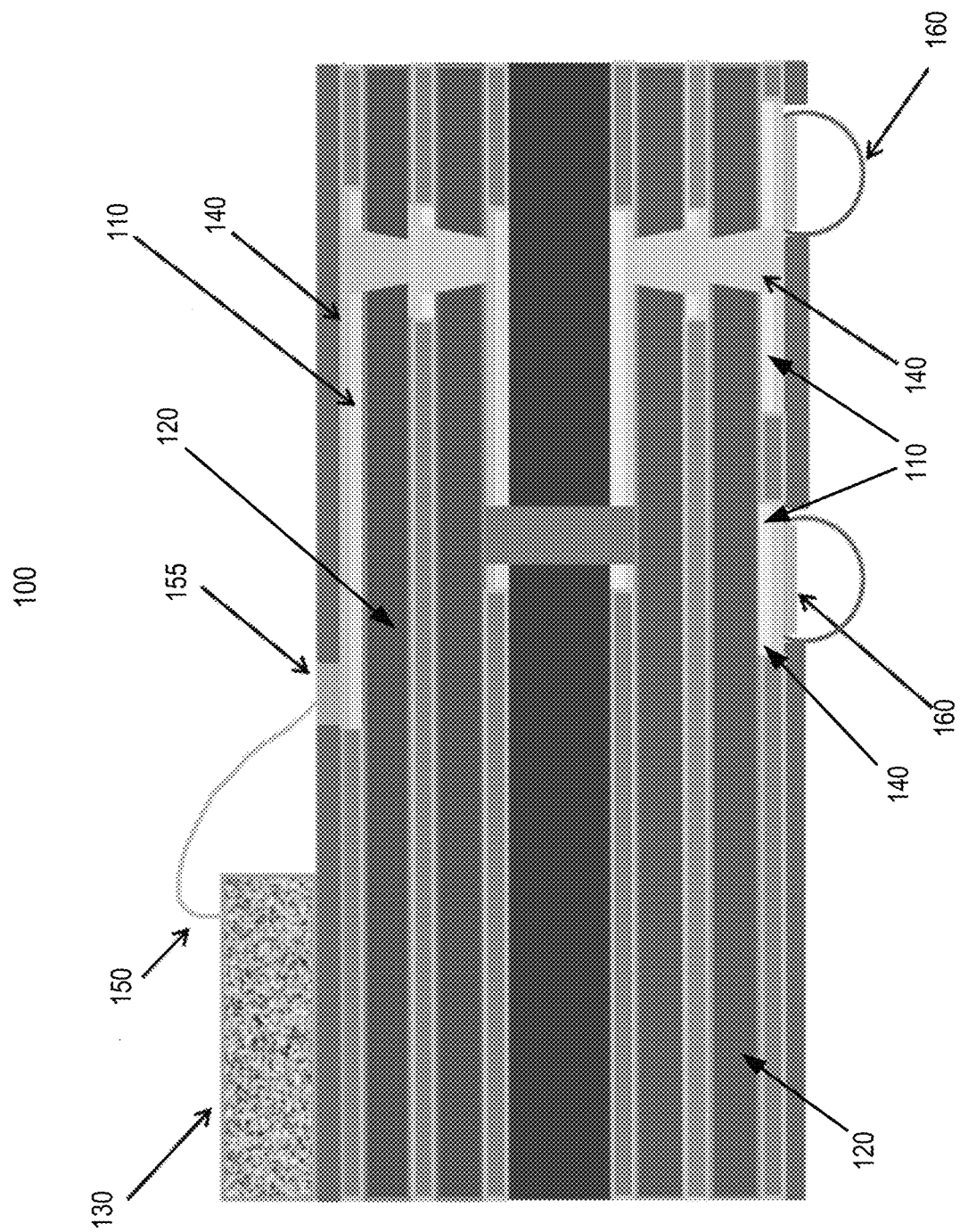

DRY METHOD OF METALLIZING POLYMER THICK FILM SURFACES

RELATED APPLICATIONS

This application claims priority to U.S. Provisional Application No. 62/535,088, filed Jul. 20, 2017, which is incorporated herein by reference in its entirety.

TECHNICAL FIELD

This disclosure relates to the field of electrical circuits, more specifically to metallizing polymer thick film surfaces.

DESCRIPTION OF RELATED ART

Forming electrical circuits on single or multiple layers that is solder and wire bondable can be achieved using both organic (polymer based like epoxy) and inorganic (ceramic or metal) substrates. Organic substrates are by far the most commonly used material due to the cost savings and/or better electrical characteristics.

Manufacturing of multiple layers of electrical circuits on organic substrate typically involves many different types of wet aqueous chemical solutions that are not environmentally friendly, such as copper electroless plating, copper electroplating, copper etching, photoresist developing, photoresist stripping, solder resistance image developing, microetchants, permanganate desmearing, solder resist development, and finish plating such as nickel and gold, or nickel/palladium/gold, or silver or tin plating.

Electrical circuits made using organic substrates have a dielectric constant (Dk) that is half of those used for low temperature co-fire ceramic technology (LTCC). Electrical circuits are typically made from copper with circuit trace geometry as fine as 25 micron ($\mu$m) in mass production. The cost of making circuits using organic substrates is 2-4× less than using LTCC technology. However, a single layer circuit on an organic substrate typically requires at least four separate aqueous chemical processes, including photoresist development, photoresist stripping, copper etching, and finish plating.

As an alternative to wet aqueous chemicals, low temperature co-fire ceramic technology (LTCC) creates electrical circuits that are solderable and wire bondable. However, LTCC technology involves high material cost, is processed at 800 degrees C., is heavy in weight, has poor electrical properties, and has limited circuit geometry (circuit width and space of 0.1/0.1 mm) when compared to electrical circuits made with organic substrate material.

SUMMARY

In a first aspect, a method of manufacturing includes bonding a paste material to an organic substrate by a polymer thick film (PTF) process to form a PTF trace, coating a sinterable material over the PTF trace, and sintering the sinterable material to the PTF trace.

In a second aspect, an electrical circuit structure includes an organic substrate layer, a polymer thick film (PTF) trace formed from a paste material bonded to the organic substrate layer by a PTC process, and a sinterable material coated over and sintered to the PTF trace.

BRIEF DESCRIPTION OF THE DRAWINGS

The present application is illustrated by way of example and not limited in the accompanying figures in which like reference numerals indicate similar elements and in which:

FIG. 1 illustrates an example electrical circuit structure in a semiconductor package.

DETAILED DESCRIPTION

The detailed description that follows describes exemplary embodiments and the features disclosed are not intended to be limited to the expressly disclosed combination(s). Therefore, unless otherwise noted, features disclosed herein may be combined to form additional combinations that were not otherwise shown for purposes of brevity.

The present disclosure provides a method for manufacturing electrical circuits on organic, using a pure additive and selective process without any wet aqueous chemical processes, that allows other components to be electrically connected using wire bonding and/or solder manufacturing methods, or any conductive epoxy specially formulated for attaching components. The disclosed method for manufacturing produces electrical circuits with circuit traces securely bonded to organic substrates that are wire bondable or solderable and additionally exhibit low trace resistance (i.e. electrical resistance of a circuit trace).

FIG. 1 illustrates an example electrical circuit structure 100 in a semiconductor package. The electrical circuit structure combines a polymer thick film (PTF) process and sintering. A paste material 110 is printed and bonded to a circuit board 120 made of an organic substrate using the PTF process to form a PTF trace 110. The PTF trace 110 can, for example, carry signals from a semiconductor chip 130 to external leads.

The PTF trace is then coated with a sinterable material that provides the ability to wire bond 155 or solder 160 to the sinterable material 140 coating over the PTF trace 110. The PTF trace 110 provides a polymeric bond to the organic substrate of the circuit board while the sinterable material 140 provides a metallurgical bond to the exposed metal micron size particles of the PTF trace 110.

In an example implementation, the Polymer thick film (PTF) process uses an organic polymer, such as epoxy, that is mixed with small, micron size of metal particles (fillers) to form the paste material. Typical filler size is 0.2-30 microns and the particles can have a flake or spherical shape. The PTF trace can be screen printed using this paste material and cured at temperatures between 120-190 degrees Celsius for approximately 1 hour.

The amount of metal filler mixed in the epoxy is typically between 30% and 70% volume. The epoxy binds the metal particles together and binds printed circuit traces to the organic substrate. Typical metal filer used in the epoxy are silver, copper and silver coated copper. In an example aspect, the amount of metal filer used in the epoxy ranges between 60% and 91% by weight. Various metals and epoxy types can be used to form the paste. Generally, more than around 90-92% metal by weight is undesirable because the paste becomes difficult to print due to high thickness.

Applicants evaluated trace resistance for various PTF materials by printing and curing a serpentine trace. The trace resistance for the various PTF materials tested ranges between 40 ohms to 4 ohms, immediately after cure. After four reflow cycles, the resistance range decreased to between 21 ohms to 2.7 ohms. The reduction in resistance is due, at least in part, to the increased cross linking for polymer shrinking the polymer and the increase contact of the metal filler particles.

There is a general correlation between bulk resistances and trace resistance. As a point of reference, the bulk resistance of copper or silver is about 1.6-1.7 $\mu$m-cm. For example, bulk resistance of 100 μm-cm translated to 18-21 ohm trace resistance and bulk resistance of 12 μm-cm translated to 2.7 ohms.

Certain evaluated PTF materials were found to have low trace resistance at around 3 ohms, but were not wire bondable or solderable. Wire bonding involves ultrasonic vibration and heat. When attempting to wire bond, the small metal fillers break free of the polymer binding them together and thus the wire does bond. For soldering, during the solder reflow temperatures, the metal fillers in the conductive polymer goes into and dissolves in the solder until only the epoxy surface remains.

By using copper or silver coated copper filler, soldering to PTF is possible, but with tradeoffs in electrical and mechanical properties. Various formulations of the PTF materials come with tradeoffs between solderability, adhesion and conductivity. For example, increased solderability can reduce electrical conductivity (i.e., increase circuit resistance).

In an example implementation, using PTF technology, a selected paste material is screen printed to an organic substrate and cured using form a PTF conductive trace. A sinterable material is then coated over and sintered to the PTF conductive trace.

The sinterable material provides the ability to wire bond or solder to the sinterable material coating over the polymer thick film. Sintering is a processing of causing a powdered material to coalesce into a solid or porous mass by heating and compression without liquefaction. In some implementations sintering methods include using light (using wave length around 1065 nm) using heat (180-400 degrees C.) and using heat and pressure (1 Mpa-10 Mpa). Typical materials used for sintering include copper, silver, or gold.

Applicants evaluated a range of sinterable materials for bonding strength to a PTF trace by sintering, including nano particles of silver, copper, or gold, and determined that different results could be provided depending on adjustments to parameters such as temperature (typically between 180-200° C.), pressure (typically between 680 and 2760 kpa) and time (typically between 15-60 minutes). Naturally the above parameters are not limits and it should be noted that optimum parameters will depend on the application.

In addition, the higher the metal filler content in PTF trace, the stronger the metallurgical bond between the sinterable material and the PTF trace. For example, having metal filler content at or above 75% by weight is beneficial in creating a strong metallurgical bond between nano particles of the sinterable material and the metal filler in the PTF trace.

Pure sintered metal does not adhere well to an organic substrate. However, this issue is avoided by the disclosed implementations as the sinterable material is coated over and sintered to the PTF conductive trace, and not sintered directly to the organic substrate. In addition, the sintered material is wire bondable and solderable.

In some implementations, the sinterable material includes of 10-100 nm sized nano particles, with a typical size of around 30 nm, are mixed with organic solvent to form a paste that can be screen printed. The sinter process and sintered properties are affected by how the nano particles are made, the size distribution, how they are "capped" to prevent aggregation, and what organic solvents used for making a paste.

Low temperature sintering of sinterable material such as copper or silver metal has a bulk resistance of around 3-5 μm-cm, which is three to five times less than the most electrically conductive PTF material currently being produced. The sinterable material sintered over the PTF trace offers a lower resistance compared to the PTF trace alone. For example, the sinter/PTF combination had a resistance of at least 20 times less than currently used PTF technology, a highly advantageous and significant reduction for extremely small narrow circuit lines (e.g., 25 μm wide circuits).

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:
1. An electrical circuit structure comprising:
an organic substrate layer;
a polymer thick film (PTF) trace formed from a paste material bonded over the organic substrate layer via a PTF process, wherein the PTF trace is an electrically conductive circuit trace, wherein the paste material comprises metal fillers between 0.2 to 30 microns in size, make up between 30% to 70% of the paste material in volume, and between 60% to 91% of the paste material by weight;
a sinterable material coated over and sintered to the PTF trace, wherein the combination of the PTF trace and the sinterable material lay flat against the organic substrate layer; and
a wire coupled to the sinterable material via wire bonding process, wherein the wire is electrically coupled to the PTF trace through the sinterable material.

2. The electrical circuit structure of claim 1, wherein the paste material is at least 75 percent metal by weight.

3. The electrical circuit structure of claim 1, wherein the paste material is formed by mixing an organic polymer with a metal filler.

4. The electrical circuit structure of claim 3, wherein the organic polymer comprises an epoxy and the metal filler comprise metal flakes or balls.

5. The electrical circuit structure of claim 1, wherein the bonding the paste material to the organic substrate comprises screen printing the paste material and then curing.

6. The electrical circuit structure of claim 1, wherein the sinterable material is at least one of silver, copper, or gold.

7. The electrical circuit structure of claim 1, wherein the sinterable material comprises nanoparticles between 10 to 100 nanometers in size.

\* \* \* \* \*